United States Patent
Shcheglov et al.

(12)

(10) Patent No.: US 10,794,700 B1
(45) Date of Patent: Oct. 6, 2020

(54) STRESS ISOLATION OF RESONATING GYROSCOPES

(71) Applicant: Garmin International, Inc., Olathe, KS (US)

(72) Inventors: Kirill V. Shcheglov, Duarte, CA (US); David Smukowski, Seattle, WA (US); Nolan F. Maggipinto, Santa Barbara, CA (US)

(73) Assignee: Garmin International, Inc., Olathe, KS (US)

( * ) Notice: Subject to any disclaimer, the term of this patent is extended or adjusted under 35 U.S.C. 154(b) by 219 days.

(21) Appl. No.: 15/337,681

(22) Filed: Oct. 28, 2016

Related U.S. Application Data

(60) Provisional application No. 62/248,693, filed on Oct. 30, 2015.

(51) Int. Cl.
*G01C 19/5684* (2012.01)
*G01C 25/00* (2006.01)

(52) U.S. Cl.
CPC ......... *G01C 19/5684* (2013.01); *G01C 25/00* (2013.01); *B81B 2201/0242* (2013.01)

(58) Field of Classification Search
CPC .............. G01C 19/567; G01C 19/5677; G01C 19/5684; G01C 19/5691; G01C 19/5733; G01C 19/5755; G01C 19/5656; G01C 25/00; H03H 2009/155; H03H 2009/0244; H03H 2003/027; H03H 9/2431; H03H 9/2436
USPC .......................................... 73/504.12–504.13
See application file for complete search history.

(56) References Cited

U.S. PATENT DOCUMENTS

| | | | |
|---|---|---|---|
| 4,779,985 A | * | 10/1988 | Wirt ................ G01C 19/70 356/476 |
| 6,079,272 A | | 6/2000 | Stell |
| 6,360,601 B1 | | 3/2002 | Challoner |
| 6,367,786 B1 | | 4/2002 | Gutierrez |
| 6,467,346 B1 | | 10/2002 | Challoner |
| 6,584,845 B1 | | 7/2003 | Gutierrez |

(Continued)

FOREIGN PATENT DOCUMENTS

| | | | | |
|---|---|---|---|---|
| WO | WO 2005/100237 | | 10/2005 | |
| WO | WO-2005100237 A1 | * | 10/2005 | ......... B81C 1/00357 |

OTHER PUBLICATIONS

Challoner et al, Boeing Disc Resonator Gyroscope, IEEE (Year: 2014).*

(Continued)

*Primary Examiner* — David L Singer
(74) *Attorney, Agent, or Firm* — Samuel Korte; Max Ali

(57) ABSTRACT

To isolate an active portion of a gyroscope resonator from mounting stresses propagating through a resonator attachment center, the resonator includes a stress isolation feature that includes alternating concentric symmetric regions of high and low stiffness. The resonator may be separated into a large number of thin, compliant spring elements and larger stiff mass elements, the aggregate areas of which optimized for an aggregate resonator spring constant (by selecting a width and a length of the spring elements), an aggregate mass (by selecting a size of the mass elements), a thermoelastic loss maximum (by selecting a width of the spring elements) and an operating frequency (by selecting a ratio of the aggregate spring to the aggregate mass).

18 Claims, 4 Drawing Sheets

(56) References Cited

U.S. PATENT DOCUMENTS

| | | |
|---|---|---|
| 6,598,455 B1 | 7/2003 | Raevis |
| 6,675,630 B2 | 1/2004 | Challoner |
| 6,796,179 B2 | 9/2004 | Bae |
| 6,823,734 B1 | 11/2004 | Hayworth |
| 6,882,964 B2 | 4/2005 | Bayard |
| 6,915,215 B2 | 7/2005 | M'Closkey |
| 6,944,931 B2 | 9/2005 | Shcheglov |
| 6,955,084 B2 | 10/2005 | Challoner |
| 6,990,863 B2 | 1/2006 | Challoner |
| 7,017,410 B2 | 3/2006 | Challoner |
| 7,040,163 B2 | 5/2006 | Shcheglov |
| 7,159,441 B2 | 1/2007 | Challoner |
| 7,168,318 B2 | 1/2007 | Challoner |
| 7,285,844 B2 | 10/2007 | Hayworth |
| 7,437,253 B2 | 10/2008 | Shcheglov |
| 7,818,871 B2 | 10/2010 | Shcheglov |
| 8,151,640 B1 * | 4/2012 | Kubena .............. G01C 19/5684 73/503.3 |
| 8,766,745 B1 * | 7/2014 | Kubena .............. H03H 3/0072 333/186 |
| 9,046,541 B1 * | 6/2015 | Kubena .............. H03H 3/0072 |
| 2004/0055380 A1 * | 3/2004 | Shcheglov ......... G01C 19/5684 73/504.12 |
| 2004/0055381 A1 * | 3/2004 | Shcheglov ............. B81C 3/001 73/504.12 |
| 2005/0172714 A1 * | 8/2005 | Challoner ......... G01C 19/5684 73/504.12 |
| 2005/0274183 A1 * | 12/2005 | Shcheglov ............. B81C 3/001 73/504.12 |
| 2006/0037417 A1 * | 2/2006 | Shcheglov ......... G01C 19/5684 74/5.4 |
| 2006/0162146 A1 * | 7/2006 | Shcheglov ......... G01C 19/5684 29/594 |
| 2007/0017287 A1 * | 1/2007 | Kubena ............. G01C 19/5684 73/504.02 |
| 2007/0084042 A1 * | 4/2007 | Challoner ......... G01C 19/5684 29/592.1 |
| 2007/0119258 A1 * | 5/2007 | Yee .................... G01C 19/5684 73/649 |
| 2008/0148846 A1 * | 6/2008 | Whelan ............. G01C 19/5684 73/504.12 |
| 2008/0295622 A1 * | 12/2008 | Challoner ......... G01C 19/5684 74/5.6 D |
| 2009/0301194 A1 * | 12/2009 | Challoner ......... G01C 19/5684 73/504.12 |
| 2010/0024546 A1 * | 2/2010 | Challoner ......... G01C 19/5684 73/504.08 |
| 2010/0024560 A1 * | 2/2010 | Shcheglov ......... G01C 19/5684 73/649 |
| 2010/0071465 A1 * | 3/2010 | Stewart ............. G01C 19/5684 73/504.02 |
| 2010/0251818 A1 * | 10/2010 | Ge .................... G01C 19/5684 73/504.12 |
| 2010/0270632 A1 * | 10/2010 | Ge .................... G01C 19/5684 257/417 |
| 2010/0300202 A1 * | 12/2010 | Joyce ................. G01C 19/5663 73/504.15 |
| 2015/0115377 A1 * | 4/2015 | DeNatale .......... G01C 19/5712 257/415 |
| 2015/0192415 A1 * | 7/2015 | Ge .................... G01C 19/5776 73/504.13 |
| 2016/0123735 A1 * | 5/2016 | Gregory ............ G01C 19/5684 73/504.13 |
| 2016/0327390 A1 * | 11/2016 | Serrano ............. G01C 19/5698 |

OTHER PUBLICATIONS

Satrom et al, Disc Resonating Gyroscopes: A Summary of a Recent Development in MEMS Technology, (Year: 2006).*

Didier et al, FPGA platform for MEMS Disc Resonance Gyroscope (DRG) control, Event: SPIE Defense and Security Symposium, 2008, Orlando, Florida, United States (Year: 2008).*

Ahn et al, Geometric Compensation of (100) Single Crystal Silicon Disk Resonating Gyroscope for Mode-Matching, Transducers 2013, Barcelona, Spain, Jun. 16-20, 2013 (Year: 2013).*

To et al, Materials integrity in microsystems: a framework for a petascale predictive-science-based multiscale modeling and simulation system, Comput Mech (2008) 42:485-510 (Year: 2008).*

Schwartz et al, Modal Parameter Tuning of an Axisymmetric Resonator via Mass Perturbation, Journal of Microelectromechanical Systems, vol. 24, No. 3, Jun. 2015 (Year: 2015).*

U.S. Appl. No. 15/337,436, filed Oct. 28, 2016, Shcheglov.
U.S. Appl. No. 15/337,480, filed Oct. 28, 2016, Shcheglov.
U.S. Appl. No. 15/337,572, filed Oct. 28, 2016, Shcheglov.
U.S. Appl. No. 15/337,627, filed Oct. 28, 2016, Shcheglov.

* cited by examiner

US 10,794,700 B1

STRESS ISOLATION OF RESONATING GYROSCOPES

PRIORITY CLAIM

The present application claims priority to U.S. Provisional Patent Application Ser. No. 62/248,693, filed Oct. 30, 2015, entitled "Stress Isolation of Resonating Gyroscopes" the entirety of which is hereby incorporated by reference.

BACKGROUND

1. Field

The present disclosure relates generally to gyroscope sensors. More particularly, the present disclosure relates to stress isolation of gyroscope resonating structure, such as a disc resonating gyroscope (DRG).

2. Related Art

Stresses propagating into gyroscope resonant structures have a detrimental and unpredictable effect on gyroscope performance (bias). They interact with the resonator in a linear way to produce mode splitting thus affecting the control loops and creating asymmetry that translates into bias, as well as in a nonlinear ways producing small changes in damping via thermoelastic loss changes that also depend on background stress.

Stresses propagating into a gyroscope resonator have a detrimental and unpredictable effect on gyroscope performance (bias). They interact with the resonator in a linear way to produce mode splitting thus affecting the control loops and creating asymmetry that translates into bias, as well as in a nonlinear ways producing small changes in damping via thermoelastic loss changes that also depend on background stress.

Current resonator designs utilize either a fully distributed mass/spring geometry (ring, DRG) or discrete masses on discrete springs (mass-on the spring, Quad mass, Symmetrical Resonating). The limitation of the distributed design is the fixed relationship between the mass and stiffness of the structure which allows for only a single degree of freedom in optimizing the geometry.

SUMMARY

The following summary is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

Embodiments of the invention are directed to isolation of the active portion of the resonator from the mounting stresses propagating through the resonator attachment center. Embodiments of the invention also relate to separating the resonator into a large number of thin, compliant "spring" elements and stiff but much more massive "mass" elements.

According to one aspect of the invention, a resonating gyroscope is disclosed that includes a resonator comprising a central stiff mounting area, wherein the resonator comprises a plurality of mass elements and a plurality of compliant elements; and a stress isolation network in the resonator, the stress isolation network comprising a plurality of concentric symmetric regions of high and low stiffness around the central stiff mounting area, wherein the plurality of concentric symmetric regions comprise a plurality of slots arranged in a symmetrical pattern.

According to another aspect of the invention, a resonating gyroscope is disclosed that includes a resonator comprising a central stiff mounting area, a plurality of slot segments formed in the resonator concentrically and symmetrically arranged around the central stiff mounting area, wherein each slot segment comprises an elongate portion having a first width, and a tip portion having a second width, wherein the second width is greater than the first width, a plurality of compliant elements in the resonator, the plurality of compliant elements comprising a portion of the resonator between the tip portion of one of the plurality of slot segments and the elongate portion of an adjacent, concentric one of the plurality of slot segments; and a plurality of mass elements in the resonator, the plurality of mass elements comprising a portion of the resonator between the tip portion of one of the plurality of slot segments and the tip portion of another one of the plurality of slot segments, and further comprising a portion of the resonator between the elongate portion of one of the plurality of slot segments and the elongate portion of an adjacent, concentric one of the plurality of slot segments.

According to a further aspect of the invention, a method for designing a gyroscope resonator is disclosed that includes separating a resonator into a plurality of compliant elements and a plurality of mass elements; and separately optimizing the spring constant, aggregate mass, thermoelastic loss maximum and operating frequency of the resonator.

BRIEF DESCRIPTION OF THE DRAWINGS

The accompanying drawings, which are incorporated into and constitute a part of this specification, illustrate one or more examples of embodiments and, together with the description of example embodiments, serve to explain the principles and implementations of the embodiments.

DETAILED DESCRIPTION

In the following description of embodiments of the invention, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

MEMS gyroscopes use the coriolis effect to measure the angular rate of movement (the rotational movement) of the gyroscope. Gyroscopes typically determine the rotational movement using an internally moving proof mass. A typical electromechanical gyroscope comprises a suspended proof mass, gyroscope case, pickoffs, torquers and readout electronics. The proof mass—a resonator—is suspended from a base plate that is attached to the resonator at a stiff central attachment area. The proof mass vibrates, and when the gyroscope is rotated, the vibration pattern changes; sensors in the gyroscope can measure the change in vibration, and the angular rate of movement can be extracted from the measured data.

Figure 1:
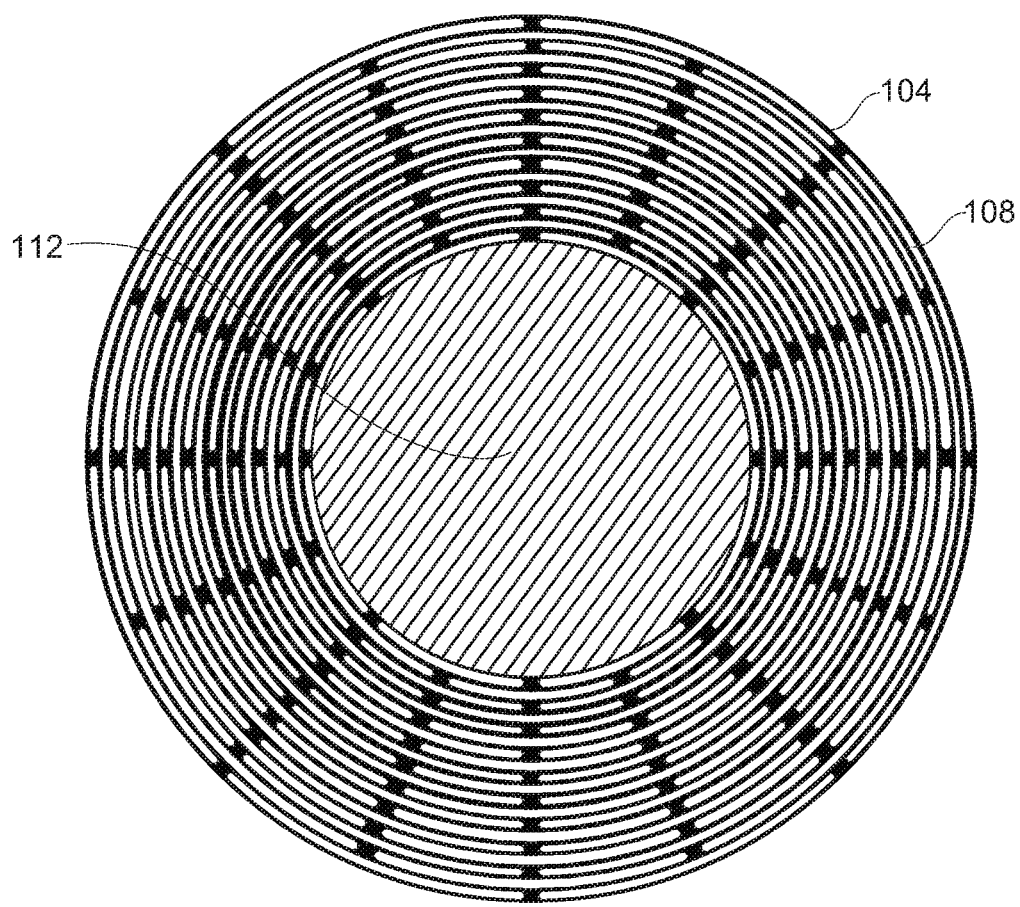
FIG. 1 is a plan view showing a resonator in accordance with one embodiment of the invention.

FIG. 1 illustrates an exemplary resonator structure for the gyroscope. In the embodiment shown in FIG. 1, the resonator structure 100 is a DRG-like resonator. Although the resonator structure 100 is shown as a disc, it will be appreciated that other planar shapes and geometries may be used.

As shown in FIG. 1, the resonator structure 100 includes a resonator body 104 and a plurality of concentric interleaved, symmetric circumferential slots 108 in the resonator body 104 surrounding a central mounting area 112. Electrodes (not shown) may be incorporated in some of the slots 108. For example, sensing electrodes may be incorporated into the outer rings, and driving electrodes may be incorporated into the inner rings. The remaining slots serve to structurally tune the resonator structure 100.

Resonator Design with Separate Control of Mass Density and Stiffness

As explained above, existing resonator designs utilize either a fully distributed mass/spring geometry (ring, DRG) or a discrete masses on discrete springs (mass-on the spring, Quad mass, SRG). The limitation of the distributed design is the fixed relationship between the mass and stiffness of the structure which allows for only a single degree of freedom in optimizing the geometry. For example, increasing the width of the ring also increases its resonant frequency while decreasing the thermoelastic loss maximum frequency. As such, the thermoelastic optimum for a nominal desired footprint (around 3-6 mm diameter resonator) occurs at much lower frequencies than are desirable from environmental considerations (below 20 kHz). In many practical applications, there is significant mechanical noise present all the way up to the high end of the audible frequency range, so the desired operating frequency is at 30 kHz or above which is suboptimal for thermoelastic loss (resonator Q (quality factor)). Accordingly, using these existing designs, there is essentially only one design parameter available to optimize three resonator properties simultaneously (the resonator mass, the thermoelastic loss frequency, and the operating frequency), thus making the system overdetermined and making it impossible to achieve a simultaneous optimum of the three resonator properties.

Figure 2:
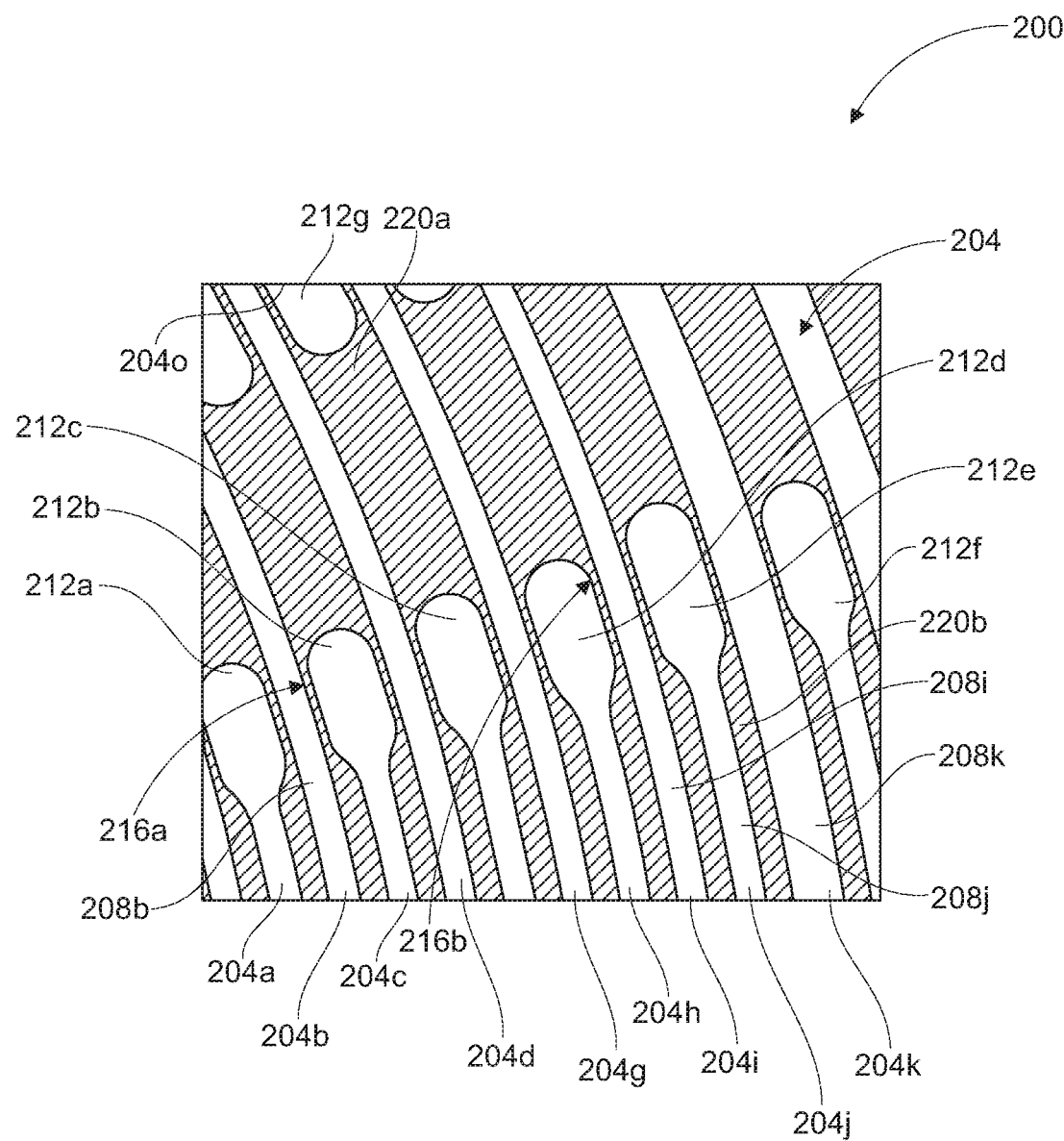
FIG. 2 is a schematic detailed diagram of the resonator design in accordance with one embodiment of the invention.

In embodiments of the invention, the resonator is separated into a large number of thin, compliant "spring" elements and stiff but much more massive "mass" elements, as shown in detail in FIG. 2. FIG. 2 illustrates the circumferential slots 108 of FIG. 1 in further detail. In particular, as shown in FIG. 2, the active portion of the resonator 200 comprises a plurality of slot segments 204. The slot segments 204 depicted in FIG. 2 are unshaded portions thereof and a plurality of mass elements 220 depicted in FIG. 2 are shaded portions thereof. The slot segments 204 are formed in the resonator 200 concentrically and are symmetrically arranged around the central stiff mounting area 112 (not shown in FIG. 2). Each slot segment 204 includes an elongate portion 208 and two tip portions 212 at each end of the elongate portion 208. A width of the tip portions 212 of each slot segment 204 is greater than a width of the elongate portion 208 of the slot segment 204, and the length of the elongate portion 208 is significantly longer than a length of each tip portion 212. For example, each slot segment 204a-204d and 204g-204k depicted in FIG. 2 includes tip portions 212, such as tip portions 212a-212g, and elongate portions 208, such as elongate portion 208b of slot segment 204b and elongate portions 208i-208k of slot segments 204i-204k.

A plurality of thin, compliant spring elements, such as a first compliant spring element 216a and a second compliant spring element 216b, are the portion of the resonator 200 between the tip portion 212 of an adjacent one of the plurality of slot segments 204 and the elongate portion 208 of an adjacent, concentric one of the plurality of slot segments 204. For example, the first compliant spring element 216a is formed between the tip portion 212b of slot segment 204c and elongate portion 208b of slot segment 204b and the second compliant spring element 216b is formed between the tip portion 212d of slot segment 204h and elongate portion 208i of slot segment 204i. It will be appreciated that the two examples of compliant spring elements 216a, 216b are merely exemplary and that each of the portions between the tip portion 212 of one slot element 204 and the elongate portion 208 of an adjacent, concentric slot segment forms a compliant spring element 216.

The plurality of mass elements 220 are the portions of the resonator 200 between a tip portion 212 of one of the plurality of slot segments 204 and a tip portion 212 of another one of the plurality of slot segments 212, as well as the portions of the resonator 200 between an elongate portion 208 of one of the plurality of slot segments 204 and an elongate portion 208 of an adjacent, concentric one of the plurality of slot segments 204. For example, the portion of the resonator 200 between the tip portion 212c of slot segment 212e and the tip portion 212g of slot segment 204o is a mass element 220a, and the portion of the resonator 200 between the elongate portion 208j of slot segment 204j and the elongate portion 208k of slot segment 208k is a mass element 220b. It will be appreciated that the two examples of mass elements 220a, 220b are merely exemplary and that each of the portions of resonator 200 satisfying the requirements outlined in the first sentence of this paragraph forms a mass element 220.

In embodiments of the invention, multiple design parameters can be separately controlled to optimize the three resonator properties—the aggregate resonator spring constant (by varying the width and the length of the "spring" elements), the aggregate mass (by varying the size of the mass elements), the thermoelastic loss maximum (by varying the width of the spring elements), and the operating frequency (by controlling the ratio of the aggregate spring to the aggregate mass). In general, three independent design parameters are used to optimize three resonator properties, thus making the system fully determined (but not overdetermined, as in the case of the distributed resonator designs), and allowing for concurrent optimization of the three critical resonator properties. In addition, by "apodizing" the spring profile, control of the overall modeshape is gained, thus reducing unwanted higher mode spatial harmonics which lead to Angle-Dependent bias via interaction with resonator nonlinearities. One additional benefit is the ability to individually tune the stiffness and the natural frequency of the subsections of the resonator, thus enabling a much higher control of the overall modeshape, and the ability to control the elastic energy and force distribution during vibration. This can lead to enhanced resonator Q's, better isolation from outside stresses, and a precise control of thermal gradients in thermally dynamic environments.

Stress Isolation

Stresses propagating into the resonator have a detrimental and unpredictable effect on gyroscope performance (bias).

They interact with the resonator in a linear way to produce mode splitting thus affecting the control loops and creating asymmetry that translates into bias. They also interact with the resonator in nonlinear ways to produce small changes in damping via thermoelastic loss changes that also depend on background stress. To better isolate the active portion of the resonator from the mounting stresses propagating through the resonator attachment center area, embodiments of the invention incorporate a stress isolation scheme into the resonator structure 100 that alternates concentric symmetric regions of high and low stiffness. Since the bending stiffness of a beam scales as thickness cubed, a pair of rings 1× and 10 in width would reduce the asymmetric stress by a factor of 1,000 (while reducing the symmetric component by a factor of 10).

Figure 3:
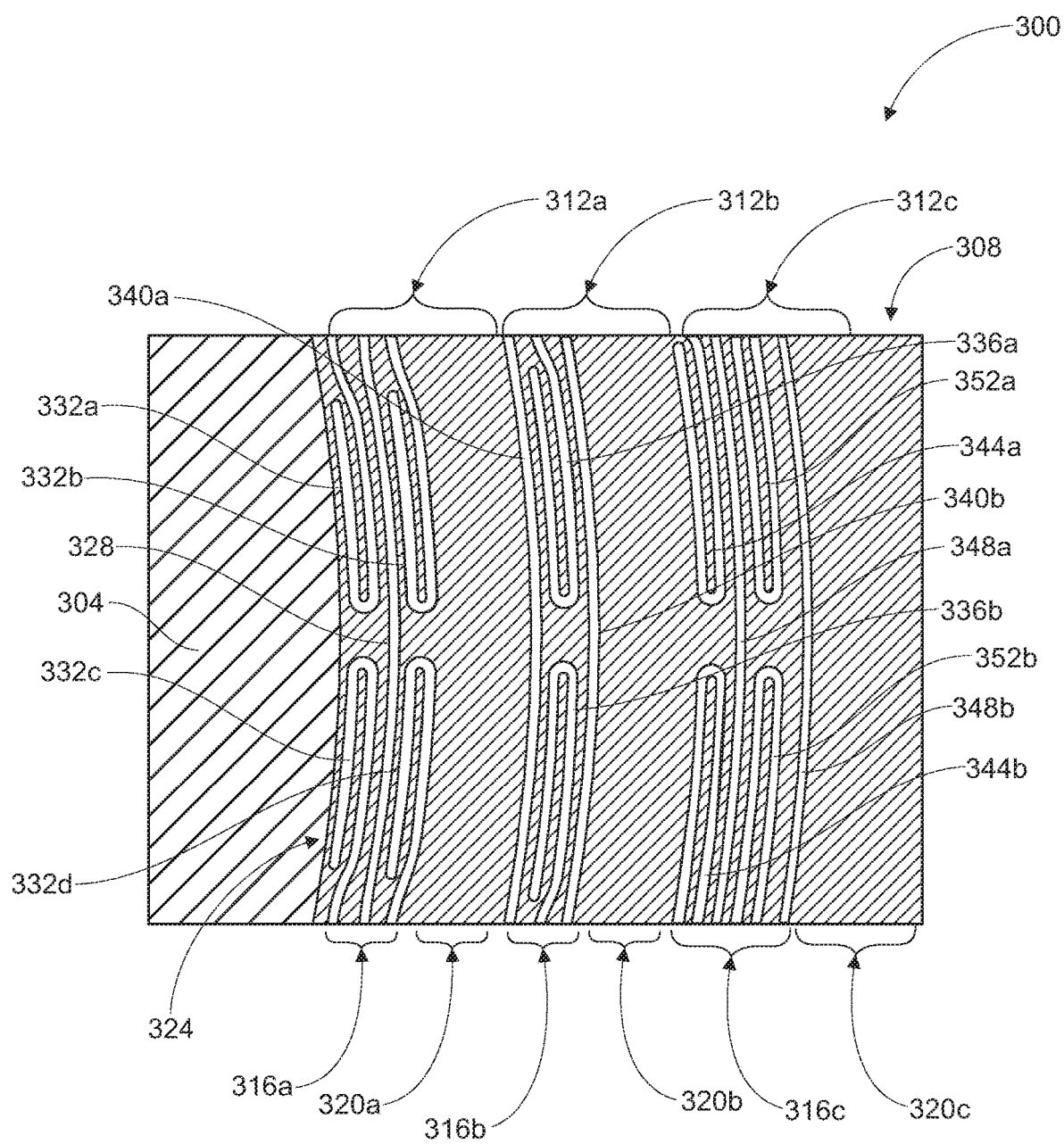
FIG. 3 is a detailed schematic view illustrating stress isolation of the resonator in accordance with one embodiment of the invention.

FIG. 3 shows a schematic of an exemplary stress isolation scheme according to one embodiment of the invention. As shown in FIG. 3, the central stiff mounting area 304 of the resonator 300 is surrounded by a stress isolation feature 308 (i.e., the stress isolation feature 308 is located between the central stiff mounting area 304 and the active portion (the portion with the slots 108/204 of the resonator). The stress isolation feature 308 uses three pairs of high stiffness/low stiffness areas 312a, 312b, 312c (collectively, 312). Each pair 312 includes a soft region 316a, 316b, 316c (collectively, 316) and a stiff region 320a, 320b, 320c (collectively, 320). Each of the soft regions 316 includes a plurality of openings 324. The plurality of openings are positioned concentrically around the central stiff resonator mounting area 304.

As shown in FIG. 3, soft region 316a includes a central elongate opening 328 and four elongated U-shaped openings 332a-d; soft region 316b includes two central elongated U-shaped openings 336a-b and two elongate openings 340a-b; and, soft region 316c includes two elongated U-shaped openings 344a-b, an elongate opening 348a, two additional elongated U-shaped openings 352a,b and a further elongate opening 348b. As shown in FIG. 3, each of the soft regions 316a, 316b, 316c has a different configuration of the openings 324; it will be appreciated however that each of the soft regions 316a, 316b, 316c may have the same configuration of the openings 324. Likewise, it will be appreciated that the particular configuration of the openings 324 may differ from that shown in FIG. 3.

The configuration shown in FIG. 3 reduces the stress asymmetry propagated into the active structure by a factor of $10^9$. Given a maximum native bias of 10,000°/hr, in embodiments of the invention, the resulting mounting stress contribution to the bias should be below $10^{-5}$°/hr, well under the design target of $10^{-3}$°/hr.

Figure 4:
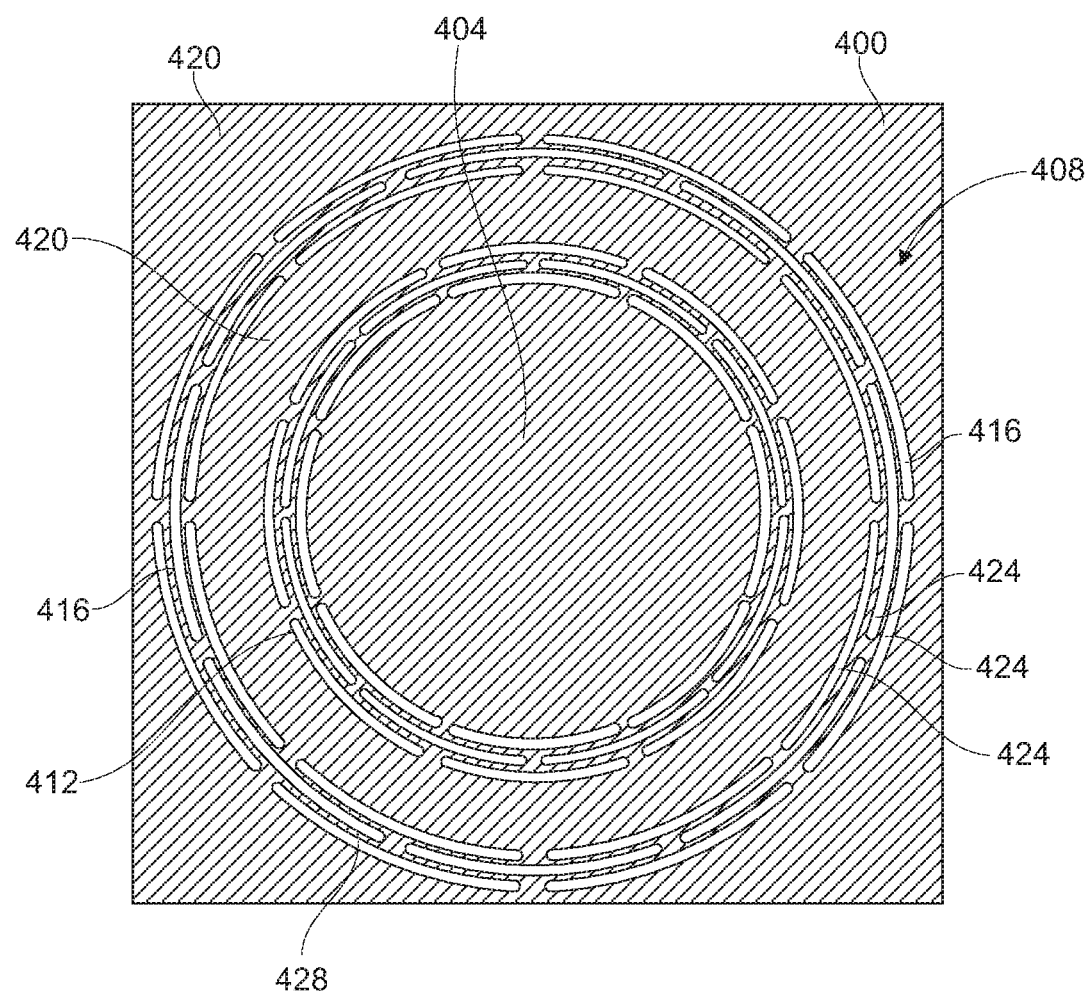
FIG. 4 is a schematic view of stress isolation features of an electrical wafer in accordance with one embodiment of the invention.

FIG. 4 illustrates an electrical wafer of the gyroscope that also includes a stress isolation feature. The feature shown in FIG. 4 serves to isolate stress in the die attach area of the sensor from the rest of the chip. In particular, as shown in FIG. 4, the electrical mounting wafer 400 includes a central die attach area 404 surrounded by a stress isolation feature 408. The stress isolation feature 408 uses two pairs of high stiffness/low stiffness areas 412. Each pair of high stiffness/low stiffness areas 412 includes a soft region 416 and a stiff region 420. As shown in FIG. 4, each of the soft regions 416 includes three annular rings 424 of circumferential slot elements 428. It will be appreciated that the soft region may incorporate fewer than or more than three annular rings. In FIG. 4, each of the three annular rings 424 is shown as having eight slot elements 428; it will also be appreciated that the annular rings may include fewer than or more than eight slot elements.

The invention has been described in relation to particular examples, which are intended in all respects to be illustrative rather than restrictive. Those skilled in the art will appreciate that many different combinations will be suitable for practicing the present invention. Moreover, other implementations of the invention will be apparent to those skilled in the art from consideration of the specification and practice of the invention disclosed herein. Various aspects and/or components of the described embodiments may be used singly or in any combination. It is intended that the specification and examples be considered as exemplary only, with a true scope and spirit of the invention being indicated by the following claims.

What is claimed is:

1. A resonating gyroscope comprising:
a resonator wafer comprising a resonator including a central mounting area and a first stress isolation network comprising a plurality of slot segments and, the plurality of slot segments arranged in a concentric symmetrical pattern around the central mounting area and each slot segment including an elongate portion having a first width and a first length and tip portions having a second width and a second length, the elongate portion being positioned between the tip portions, the second width being greater than the first width, and the second length being less than the first length; and
an electrical mounting wafer including a central attachment area;
wherein a plurality of mass elements and a plurality of compliant elements of the resonator wafer are formed in portions of the resonator wafer other than the plurality of slot segments and thereby improving the stress isolation of the resonator wafer from external stress;
wherein the plurality of slot segments of the resonator are offset such that the tip portions of the plurality of slot segments are separated by the elongate portions of adjacent, concentric slot segments; and
wherein the central mounting area of the resonator wafer mounts to the central attachment area of the electrical mounting wafer.

2. The resonating gyroscope of claim 1, wherein the plurality of mass elements constitute a proof mass, and wherein the plurality of compliant elements constitute a spring.

3. The resonating gyroscope of claim 1, wherein the concentric symmetrical pattern results in some slot segments being positioned closer to the central mounting area than other slot segments.

4. The resonating gyroscope of claim 1, wherein the plurality of compliant elements separate the tip portions of each slot segment of the resonator from the elongate portions of adjacent, concentric slot segments, the adjacent slot segments being positioned closer to or further from the central mounting area.

5. The resonating gyroscope of claim 1, wherein the plurality of mass elements separate the tip portion of each slot segment of the resonator from the tip portion of adjacent slot segments, the adjacent slot segments being positioned at substantially the same distance from the central mounting area.

6. The resonating gyroscope of claim 1, wherein the plurality of mass elements separate the elongate portion of each slot segment of the resonator from the elongate portion of adjacent, concentric slot segments.

7. The resonating gyroscope of claim 1, wherein the plurality of slot segments of the resonator have a lower stiffness than the plurality of mass elements and the plurality of compliant elements of the resonator, wherein the plurality of mass elements and the plurality of compliant elements are formed in portions of the resonator other than the plurality of slot segments.

8. The resonating gyroscope of claim 7, wherein the plurality of mass elements and the plurality of compliant elements of the resonator form a resonator body interleaved by the concentric symmetrical plurality of slot segments, and wherein the resonator has alternating regions of high and low stiffness around the central mounting area.

9. The resonating gyroscope of claim 1, wherein the electrical mounting wafer further includes a second stress isolation network, wherein the second stress isolation network includes a plurality of annular rings in regions having lower stiffness than adjacent regions of the second stress isolation network.

10. The resonating gyroscope of claim 1, wherein the tip portions are U-shaped.

11. A resonating gyroscope comprising:
   a resonator wafer comprising a resonator including a central mounting area and a first stress isolation network comprising a plurality of slot segments and a plurality of mass elements and a plurality of compliant elements, the plurality of slot segments concentrically and symmetrically arranged around the central mounting area and each slot segment including an elongate portion having a first width and a first length and a tip portion having a second width and a second length, the elongate portion being positioned between the tip portions, the second width being greater than the first width, and the second length being less than the first length; and
   an electrical mounting wafer including a central attachment area;
   wherein the plurality of compliant elements comprising a portion of the resonator between the tip portion of one of the plurality of slot segments and the elongate portion of an adjacent, concentric one of the plurality of slot segments;
   wherein a plurality of mass elements comprising a portion of the resonator between the tip portion of one of the plurality of slot segments and the tip portion of another one of the plurality of slot segments, the tip portions being positioned at substantially the same distance from the central mounting area, and further comprising a portion of the resonator between the elongate portion of one of the plurality of slot segments and the elongate portion of an adjacent, concentric one of the plurality of slot segments;
   wherein a plurality of mass elements and the plurality of compliant elements of the resonator are formed in portions of the resonator other than the plurality of slot segments;
   wherein the plurality of slot segments of the resonator are offset such that the tip portions of the plurality of slot segments are separated by the elongate portions of adjacent, concentric slot segments; and
   wherein the central mounting area of the resonator wafer mounts to the central attachment area of the electrical mounting wafer;
   wherein the plurality of mass elements and the plurality of compliant elements improve the stress isolation of the resonator wafer from external stress.

12. The resonating gyroscope of claim 11, wherein the plurality of slot segments of the resonator have a lower stiffness than the plurality of mass elements and the plurality of compliant elements of the resonator, wherein the plurality of mass elements and the plurality of compliant elements are formed in portions of the resonator other than the plurality of slot segments.

13. The resonating gyroscope of claim 12, wherein the plurality of mass elements and the plurality of compliant elements of the resonator form a resonator body interleaved by the concentric symmetrical plurality of slot segments.

14. The resonating gyroscope of claim 13, wherein the resonator has alternating regions of high and low stiffness around the central mounting area.

15. The resonating gyroscope of claim 11, wherein the concentric symmetrical pattern results in some slot segments being positioned closer to the central mounting area than other slot segments.

16. The resonating gyroscope of claim 11, wherein the tip portions are U-shaped.

17. The resonating gyroscope of claim 11, wherein the electrical mounting wafer further includes a second stress isolation network, wherein the second stress isolation network includes a plurality of annular rings in regions having lower stiffness than adjacent regions of the second stress isolation network.

18. The resonating gyroscope of claim 11, wherein the plurality of compliant elements separate the tip portions of each slot segment of the resonator from the elongate portions of adjacent, concentric slot segments, the adjacent slot segments being positioned closer to or further from the central mounting area.

* * * * *